US012700554B2

(12) United States Patent
Lu et al.

(10) Patent No.: US 12,700,554 B2
(45) Date of Patent: Aug. 4, 2026

(54) WATERPROOF BUTTON MODULE AND ELECTRONIC DEVICE

(71) Applicant: Wistron NeWeb Corporation, Hsinchu (TW)

(72) Inventors: Te-Yu Lu, Hsinchu (TW); Chiu-Hui Wu, Hsinchu (TW); Hsueh-Chu Lin, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 86 days.

(21) Appl. No.: 18/805,662

(22) Filed: Aug. 15, 2024

(65) Prior Publication Data

US 2025/0218704 A1 Jul. 3, 2025

(30) Foreign Application Priority Data

Dec. 29, 2023 (TW) ................................. 112151474

(51) Int. Cl.
| | |
|---|---|
| *H05K 5/00* | (2025.01) |
| *H01H 13/06* | (2006.01) |
| *H05K 5/02* | (2006.01) |

(52) U.S. Cl.
CPC ........... H01H 13/06 (2013.01); H05K 5/0217 (2013.01)

(58) Field of Classification Search
CPC .. H01H 13/06; H01H 2223/002; H01H 13/10; H05K 5/0217; H05K 5/069
See application file for complete search history.

(56) References Cited

U.S. PATENT DOCUMENTS

| | | | |
|---|---|---|---|
| 7,002,811 B2 * | 2/2006 | Jing ..................... | H05K 7/1408 |
| | | | 361/801 |
| 8,344,277 B1 * | 1/2013 | Bloch ................. | G06F 3/03547 |
| | | | 200/302.2 |
| 9,299,511 B2 * | 3/2016 | Yeh ......................... | H01H 13/14 |
| 9,859,072 B2 * | 1/2018 | Rong ..................... | H01H 13/06 |
| 11,622,032 B2 * | 4/2023 | Wright ................. | H04B 1/3888 |
| | | | 455/575.8 |
| 12,189,347 B2 * | 1/2025 | Davis ..................... | G01B 21/22 |

(Continued)

FOREIGN PATENT DOCUMENTS

| | | |
|---|---|---|
| JP | S59194243 U | 12/1984 |
| JP | 2008226469 A | 9/2008 |

(Continued)

*Primary Examiner* — Rockshana D Chowdhury
(74) *Attorney, Agent, or Firm* — McClure, Qualey & Rodack, LLP

(57) ABSTRACT

The present disclosure provides a waterproof button module, which is applied to an electronic device, including a button mainbody, a button shaft element and at least one elastic connecting element. The button mainbody is made of a flexible material, and the button mainbody includes a pressing portion, a connecting portion and at least two annular protruding structures. The connecting portion is integrally connected to and surrounds the pressing portion. The at least two annular protruding structures are separated from each other and disposed on the connecting portion. A first end portion of the button shaft element is connected to an inner surface of the button mainbody, and a second end portion of the button shaft element is for pressing a touch unit. The at least one elastic connecting element is connected to the button shaft.

22 Claims, 11 Drawing Sheets

(56) References Cited

U.S. PATENT DOCUMENTS

| | | | | |
|---|---|---|---|---|
| 12,237,121 B2 * | 2/2025 | Ye | H01H 13/06 | |
| 12,259,690 B2 * | 3/2025 | Pandya | G04C 3/007 | |
| 2013/0277187 A1 * | 10/2013 | Huang | H01H 13/063 | |
| | | | 200/302.2 | |
| 2013/0313087 A1 * | 11/2013 | Le | H01H 13/06 | |
| | | | 200/302.2 | |
| 2014/0085781 A1 * | 3/2014 | Zeng | H05K 5/061 | |
| | | | 361/679.01 | |
| 2014/0144762 A1 * | 5/2014 | Cheong | H01H 13/06 | |
| | | | 200/302.2 | |
| 2014/0233360 A1 * | 8/2014 | Koshoji | H01H 13/06 | |
| | | | 200/341 | |
| 2014/0262712 A1 * | 9/2014 | Chu | H01H 13/14 | |
| | | | 200/302.2 | |
| 2014/0284191 A1 * | 9/2014 | Takahashi | H01H 13/06 | |
| | | | 200/302.2 | |
| 2015/0348724 A1 * | 12/2015 | Yeh | H01H 13/14 | |
| | | | 200/530 | |
| 2016/0233034 A1 * | 8/2016 | Sheng | H01H 13/063 | |
| 2020/0243276 A1 * | 7/2020 | Heiskanen | H01H 13/06 | |
| 2021/0212230 A1 * | 7/2021 | Hsu | H04B 17/27 | |
| 2022/0076905 A1 * | 3/2022 | Fan | H01H 13/28 | |
| 2023/0030145 A1 * | 2/2023 | Huang | G05G 1/04 | |
| 2023/0266717 A1 * | 8/2023 | Yang | G04G 17/04 | |
| | | | 361/679.01 | |
| 2023/0333512 A1 * | 10/2023 | Lee | F16J 15/3236 | |

FOREIGN PATENT DOCUMENTS

| | | | |
|---|---|---|---|
| JP | 2009009823 A | 1/2009 | |
| JP | 2009164017 A | 7/2009 | |
| JP | 2021009117 A | 1/2021 | |
| TW | 201344728 A | 11/2013 | |

* cited by examiner

100

110

200

WATERPROOF BUTTON MODULE AND ELECTRONIC DEVICE

RELATED APPLICATIONS

This application claims priority to Taiwan Application Serial Number 112151474, filed Dec. 29, 2023, which is herein incorporated by reference.

BACKGROUND

Technical Field

The present disclosure relates to a button module and an electronic device. More particularly, the present disclosure relates to a button module and an electronic device that can effectively prevent the entering of the moisture and the dust.

Description of Related Art

Buttons are very important for the operation of electronic devices. However, the buttons of electronic devices are movable elements, and the internal elements of the buttons may be worn or broken after multiple presses, resulting in the electronic device cannot be operated through the buttons and then lose the functions thereof. Further, the button is assembled and disposed on the case of the electronic device for the user to press and tap the internal element and then to operate the electronic device. However, the dust and the moisture from the outside of the electronic device may enter the electronic device through the gap between the button and the case of the electronic device and then affect the internal elements thereof. Therefore, the demands of specifications of waterproofing and dustproofing of the buttons are gradually increased on the current market.

To solve the above-mentioned problems, most of the conventional button structures are coated with waterproof adhesion between the button structure and the electronic device, or an O-ring is installed in the button structure to avoid the dust and the moisture entering the electronic device. However, in the way of applying the waterproof adhesion, the waterproof adhesion may be hardened or fallen off after multiple presses, and the service life of the button structure may be reduced. Further, the use of the O-ring to obtain the interference and then to achieve the waterproof effect is prone to block the button made of a hard material by the O-ring, and thus the button cannot be pressed effectively.

Hence, how to develop a button structure that is equipped with durable, highly waterproof and dustproof properties has become the goal of research in the related industry.

SUMMARY

According to one aspect of the present disclosure, a waterproof button module includes a base, a button mainbody, a button shaft element and at least one elastic connecting element. The base includes a slotted hole. The button mainbody is disposed on the base and covers the slotted hole, wherein the button mainbody is made of a flexible material, and the button mainbody includes a pressing portion, a connecting portion and at least two annular protruding structures. The pressing portion is exposed to the slotted hole. The connecting portion is integrally connected to and surrounds the pressing portion, and the connecting portion is disposed in the slotted hole. The at least two annular protruding structures are separated from each other and disposed on the connecting portion, and the at least two annular protruding structures abut against an inner surface of the slotted hole. The button shaft element is disposed on the base, wherein a first end portion of the button shaft element is connected to an inner surface of the button mainbody, and a second end portion of the button shaft element is for pressing a touch unit. A first end of the at least one elastic connecting element is fixedly disposed on the base, and a second end of the at least one elastic connecting element is connected to the button shaft element.

According to another aspect of the present disclosure, an electronic device includes a case element, a printed circuit board and a waterproof button module. The case element has an accommodating space. The printed circuit board is disposed in the accommodating space, and the printed circuit board includes a touch unit. The waterproof button module is disposed on the case element, and the waterproof button module includes a base, a button mainbody, a button shaft element and at least one elastic connecting element. The base is disposed on the case element, and the base includes a slotted hole. The button mainbody is disposed on the base and covers the slotted hole, wherein the button mainbody is made of a flexible material, and the button mainbody includes a pressing portion, a connecting portion and at least two annular protruding structures. The pressing portion is exposed to the slotted hole. The connecting portion is integrally connected to and surrounds the pressing portion, and the connecting portion is disposed in the slotted hole. The at least two annular protruding structures are separated from each other and disposed on the connecting portion, and the at least two annular protruding structures abut against an inner surface of the slotted hole. The button shaft element is disposed on the base, wherein a first end portion of the button shaft element is connected to an inner surface of the button mainbody, and a second end portion of the button shaft element is for pressing the touch unit. An end of the at least one elastic connecting element is fixedly disposed on the base, and another end of the at least one elastic connecting element is connected to the button shaft element.

According to further another aspect of the present disclosure, a waterproof button module, which is applied to an electronic device, includes a button mainbody, a button shaft element and at least one elastic connecting element. The button mainbody is made of a flexible material, and the button mainbody includes a pressing portion, a connecting portion and at least two annular protruding structures. The connecting portion is integrally connected to and surrounds the pressing portion. The at least two annular protruding structures are separated from each other and disposed on the connecting portion. A first end portion of the button shaft element is connected to an inner surface of the button mainbody, and a second end portion of the button shaft element is for pressing a touch unit. The at least one elastic connecting element is connected to the button shaft element, wherein the at least one elastic connecting element is a curved cantilever.

BRIEF DESCRIPTION OF THE DRAWINGS

The present disclosure can be more fully understood by reading the following detailed description of the embodiment, with reference made to the accompanying drawings as follows.

DETAILED DESCRIPTION

The present disclosure will be further exemplified by the following specific embodiments with the drawings so as to facilitate utilizing and practicing the present disclosure completely by those skilled in the art without over-interpreting and over-experimenting. However, the readers should understand that the present disclosure should not be limited to these practical details. That is, in some embodiments, these practical details are used to describe how to implement the materials and methods of the present disclosure and are not necessary.

Figure 1:
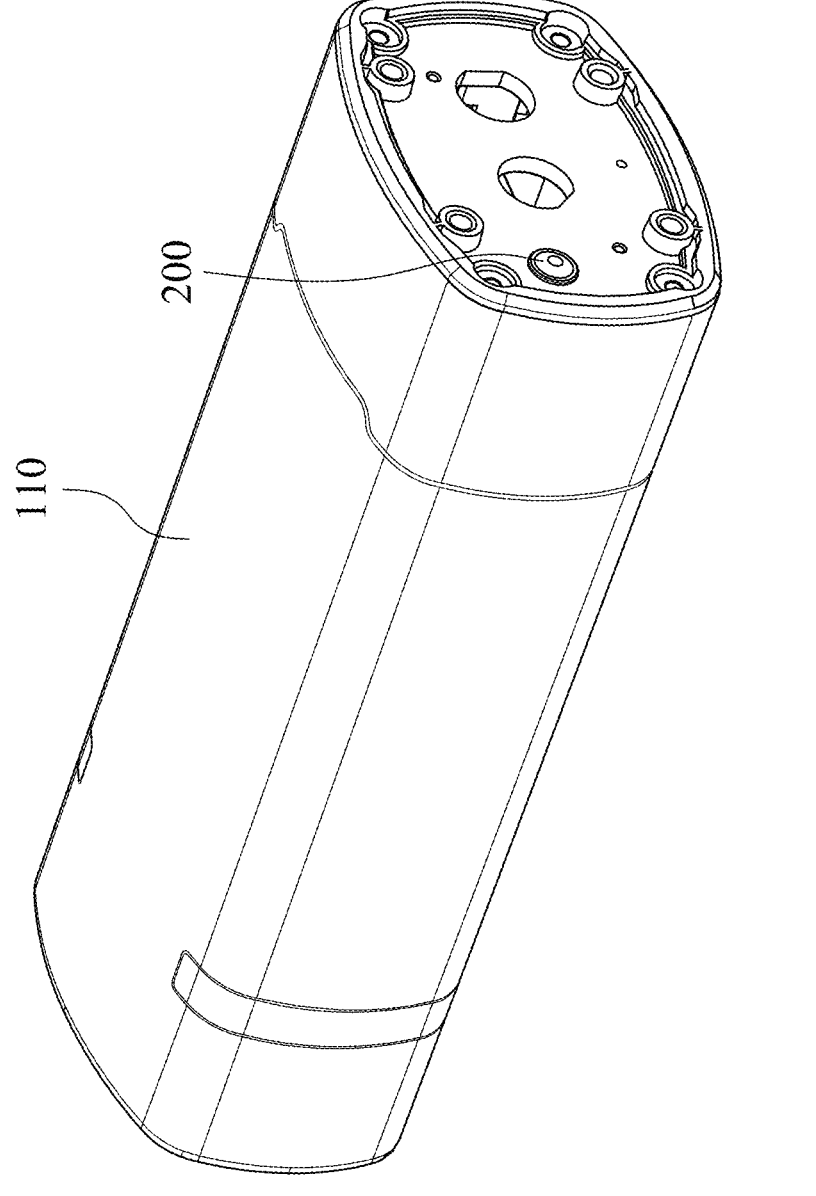
FIG. 1 is a schematic view of an electronic device of the present disclosure.
Figure 2:
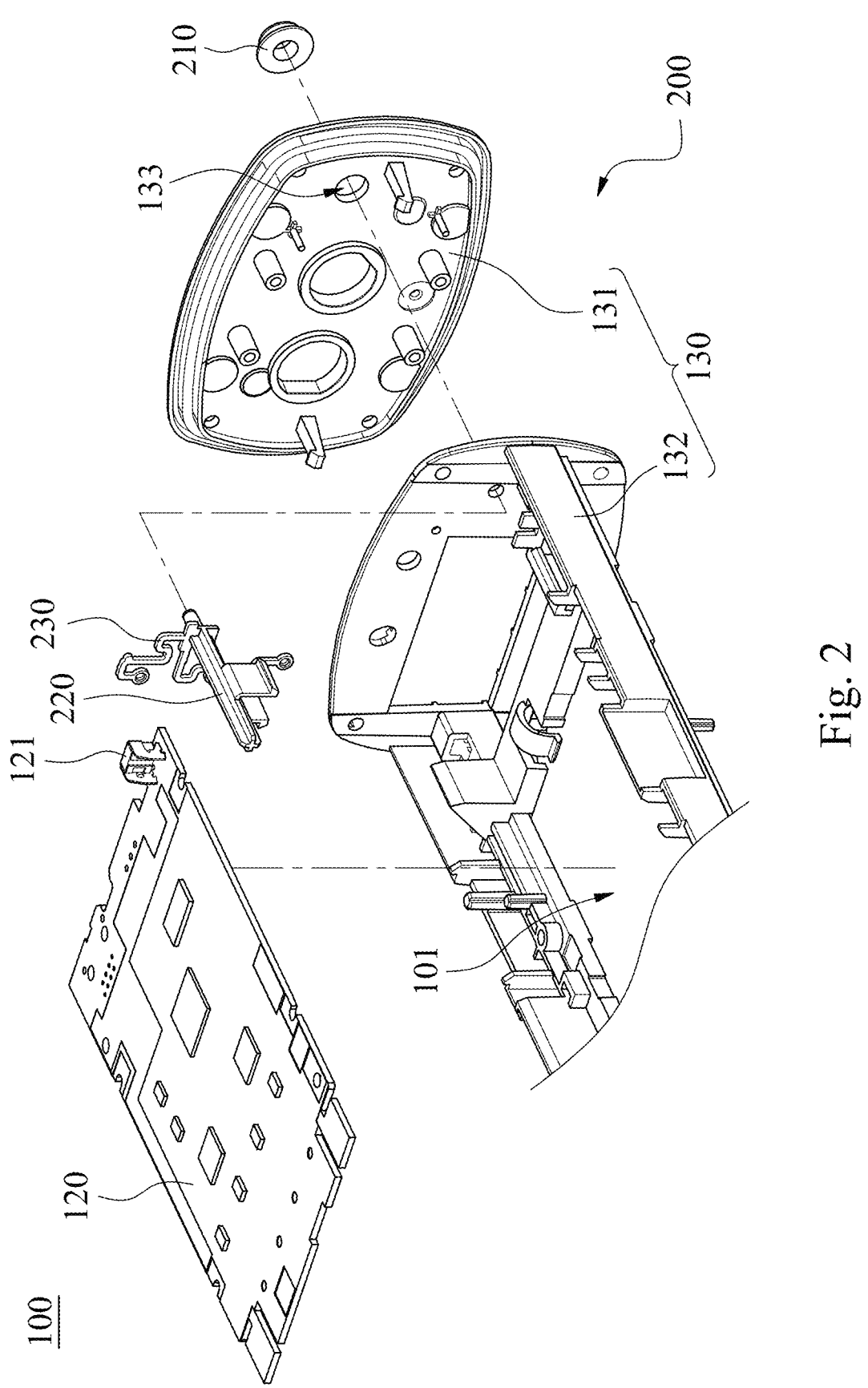
FIG. 2 is an exploded view of the electronic device of FIG. 1.
Figure 3:
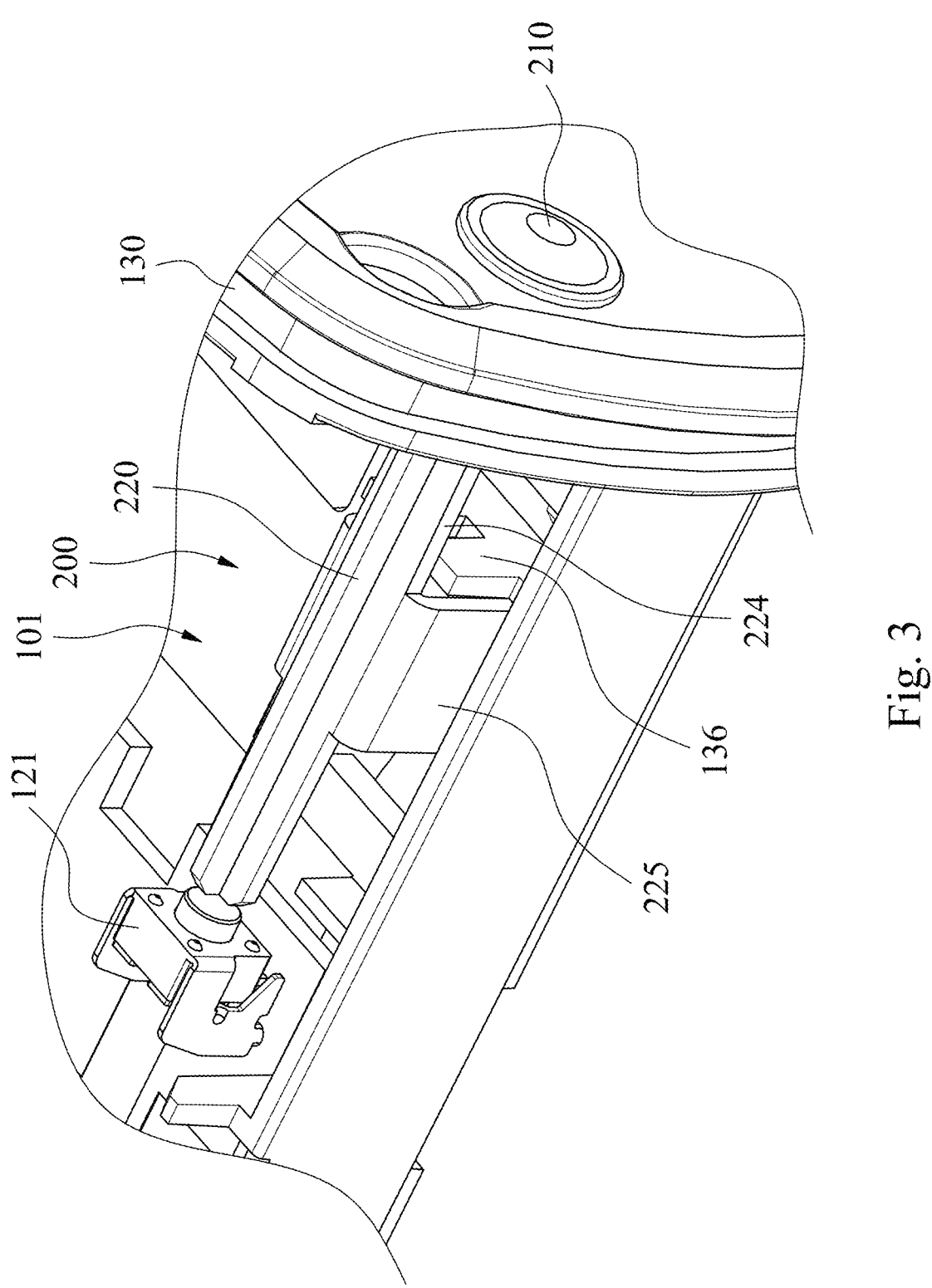
FIG. 3 is a schematic view of a waterproof button module of the electronic device of FIG. 1.
Figure 4:
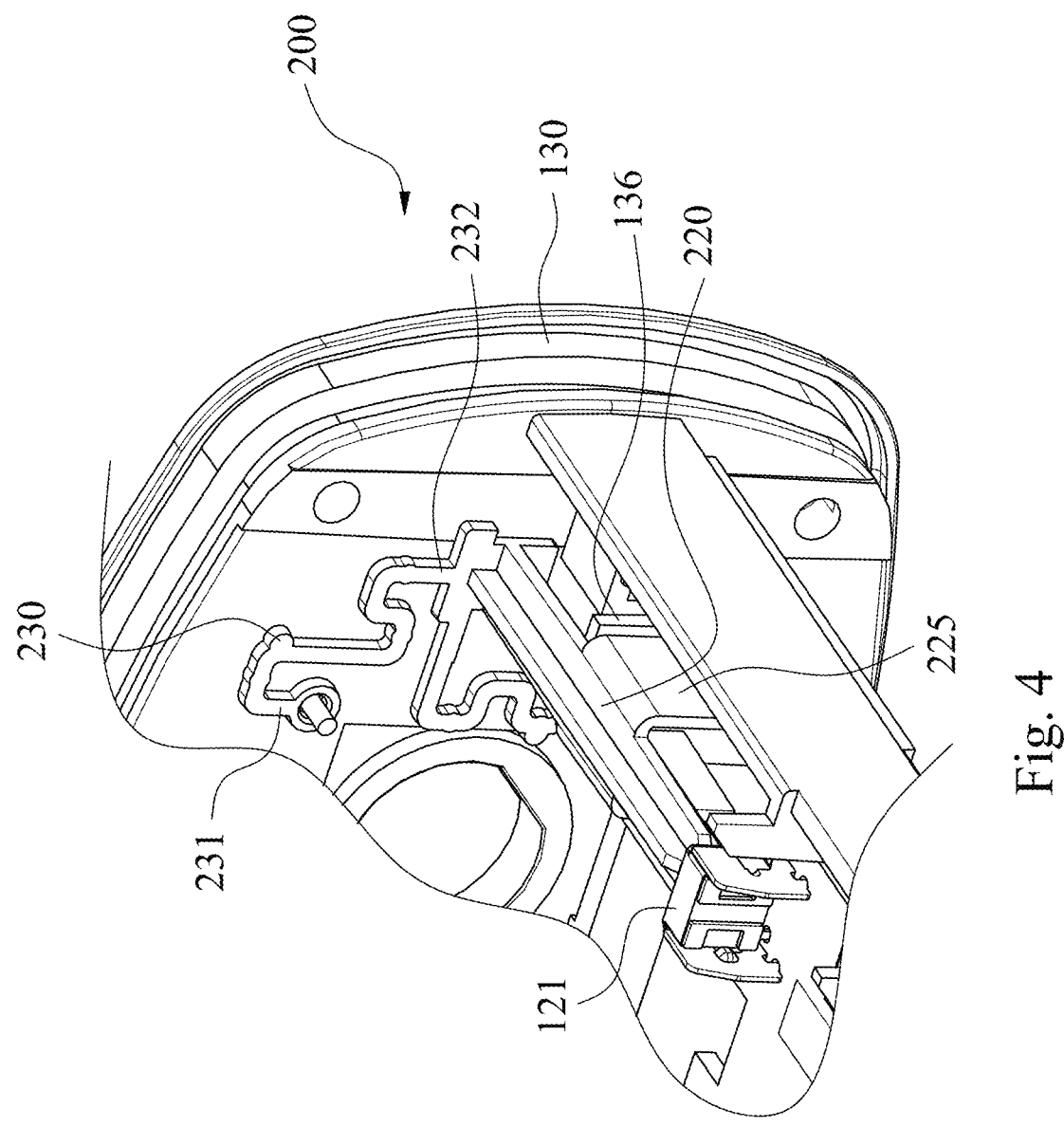
FIG. 4 is a schematic view of the waterproof button module of FIG. 3 observed from another direction.

Reference is made to FIG. 1 to FIG. 4. FIG. 1 is a schematic view of an electronic device 100 of the present disclosure, FIG. 2 is an exploded view of the electronic device 100 of FIG. 1, FIG. 3 is a schematic view of a waterproof button module 200 of the electronic device 100 of FIG. 1, and FIG. 4 is a schematic view of the waterproof button module 200 of FIG. 3 observed from another direction. The electronic device 100 includes a case element 110, a printed circuit board 120 and the waterproof button module 200.

The case element 110 has an accommodating space 101. As shown in FIG. 1, the case element 110 covers the electronic device 100 and is for isolating the accommodating space 101 from an outer space of the electronic device 100, and the material of the case element 110 can be made of a plastic material or a metal material, depending on needs. When the case element 110 is made of the plastic material, the case element 110 has excellent effect of anti-scalding, and when the case element 110 is made of the metal material, the case element 110 has excellent thermal conductivity, but the present disclosure is not limited thereto.

The printed circuit board 120 is disposed in the accommodating space 101, and the printed circuit board 120 includes a touch unit 121. The touch unit 121 is fixedly disposed on a surface (reference number is omitted) of the printed circuit board 120. The touch unit 121 can be a touching switch which has a lower rated voltage and a lower current, and the touch unit 121 can be triggered by touching, but the present disclosure is not limited thereto.

The waterproof button module 200 is disposed on the case element 110. Specifically, the waterproof button module 200 of the present disclosure is disposed on the case element 110 of the electronic device 100 through a base 130, wherein the base 130 can be a frame body inside the electronic device 100. The base 130 can also be an element of the waterproof button module 200 for connecting to the case element 110, but the present disclosure is not limited thereto. The waterproof button module 200 substantially includes a button mainbody 210, a button shaft element 220 and at least one elastic connecting element 230.

Figure 5:
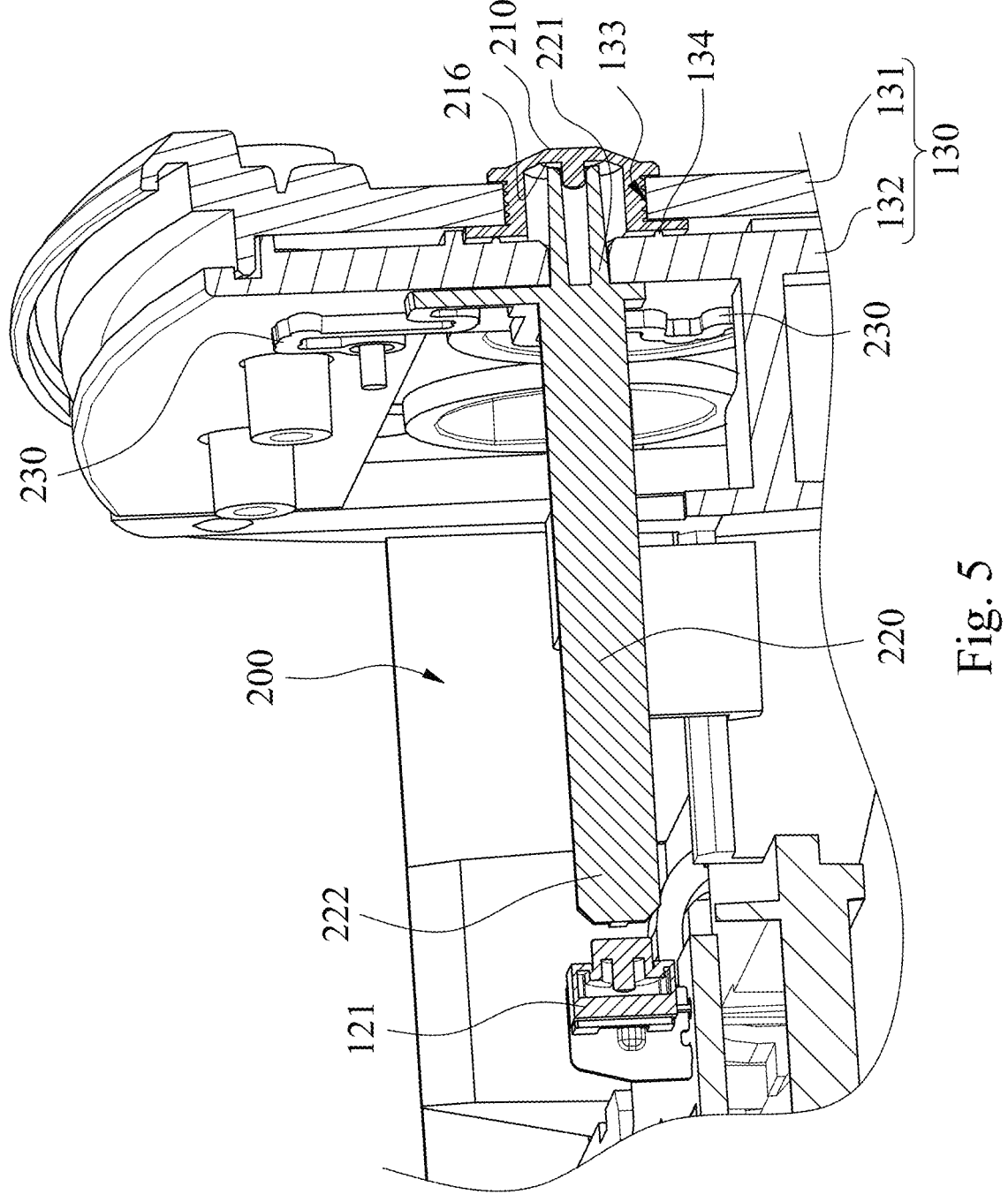
FIG. 5 is a sectional diagram of the waterproof button module of FIG. 3.
Figure 6:
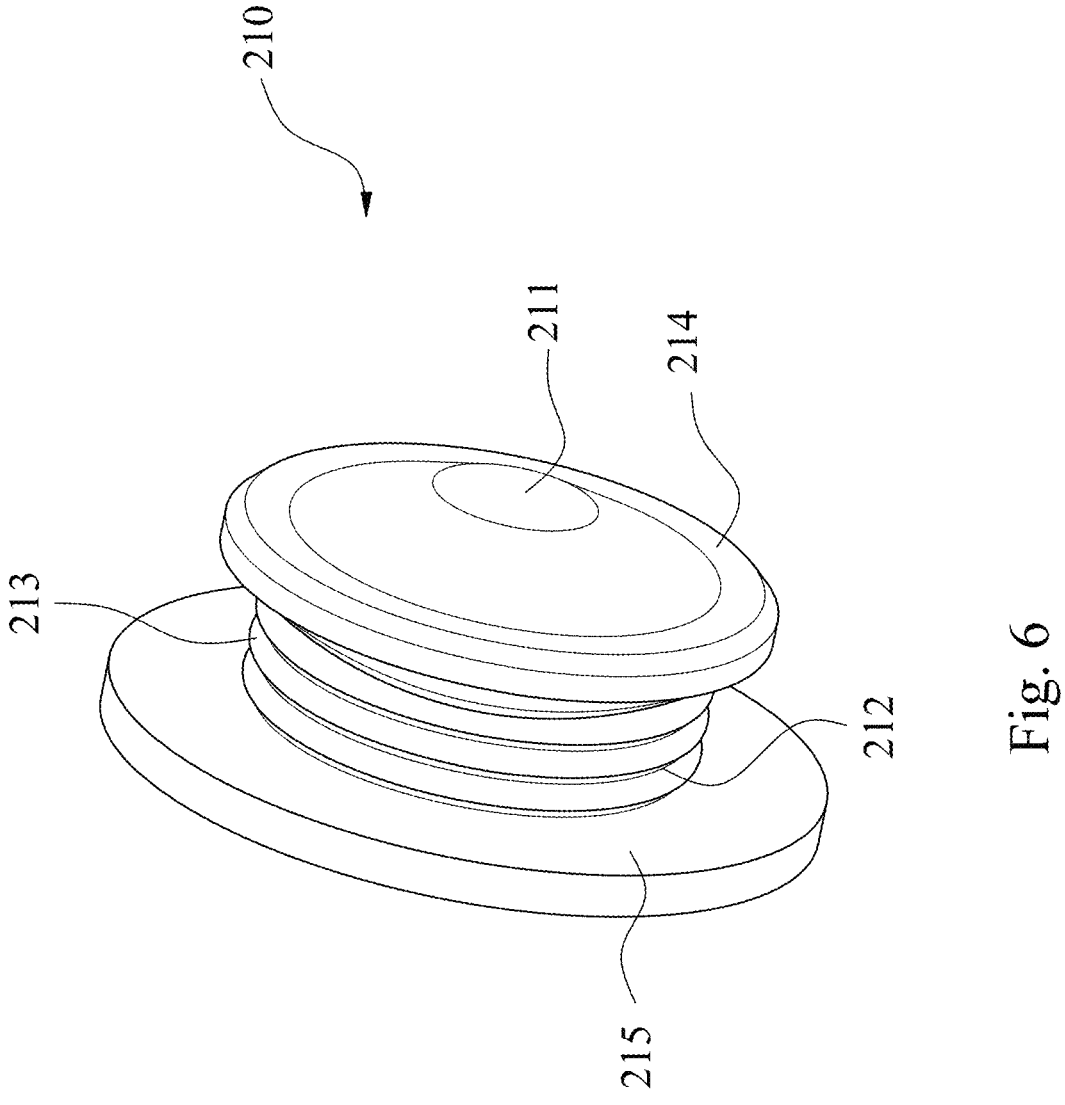
FIG. 6 is a schematic view of a button mainbody of the waterproof button module of FIG. 3.
Figure 7:
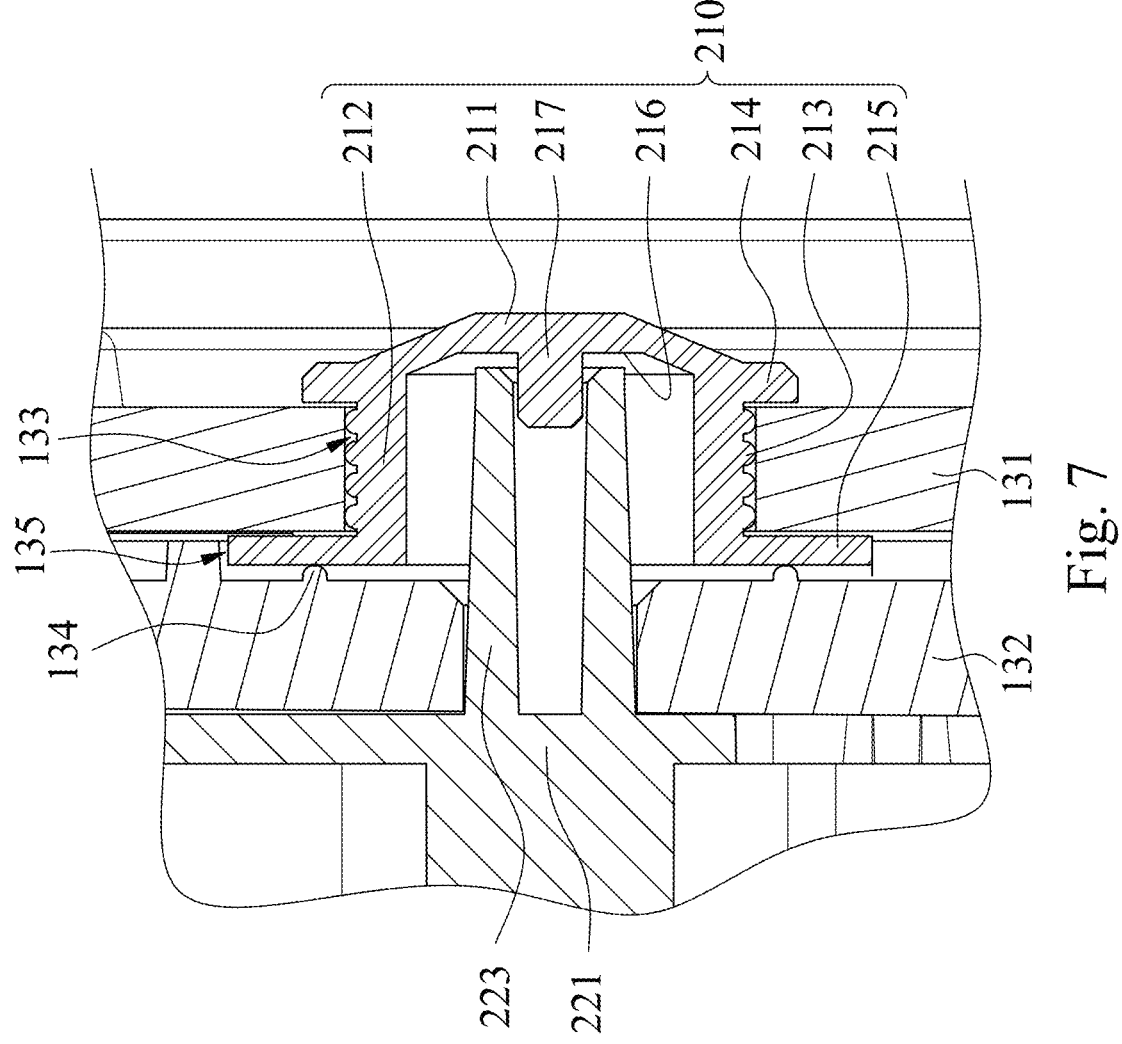
FIG. 7 is a partially enlarged diagram of the waterproof button module of FIG. 3.

Reference is made to FIG. 1 to FIG. 4 and FIG. 5 to FIG. 7 simultaneously. FIG. 5 is a sectional diagram of the waterproof button module 200 of FIG. 3, FIG. 6 is a schematic view of the button mainbody 210 of the waterproof button module 200 of FIG. 3, and FIG. 7 is a partially enlarged diagram of the waterproof button module 200 of FIG. 3. In the electronic device 100, the button mainbody 210 is disposed on the base 130, wherein the base 130 can include a slotted hole 133. The button mainbody 210 is disposed in the slotted hole 133 and covering thereon so as to prevent the moisture and the dust from entering the accommodating space 101 of the electronic device 100 through the slotted hole 133. Further, the button mainbody 210 can be made of a flexible material, the button mainbody 210 can be quickly deformed and reset during the process of multiple pressing to satisfy the demands of multiple pressing of the waterproof button module 200.

As shown in FIG. 6, the button mainbody 210 includes a pressing portion 211, a connecting portion 212, at least two annular protruding structures 213, an annular sheet 214 and an extending portion 215. The connecting portion 212 is integrally connected to and surrounds the pressing portion 211, and the at least two annular protruding structures 213 are separated from each other and disposed on the connecting portion 212. The annular sheet 214 is integrally connected to the pressing portion 211 and extends from the pressing portion 211, and the extending portion 215 is connected to a side of the connecting portion 212 different from the pressing portion 211. As shown in FIG. 3, FIG. 5 and FIG. 7 again, in the electronic device 100, the pressing portion 211 of the button mainbody 210 is exposed to the slotted hole 133 of the base 130, the connecting portion 212 is integrally connected to and surrounds the pressing portion 211 and is located in the slotted hole 133. The at least two annular protruding structures 213 abut against an inner surface (reference number is omitted) of the slotted hole 133, and the annular sheet 214 extends outward from the pressing portion 211 and covers the slotted hole 133. Therefore, the annular sheet 214 can prevent the moisture from entering the accommodating space 101 of the electronic device 100 through the gap between the button mainbody 210 and the base 130. Further, by the arrangement that the at least two annular protruding structures 213 are gradually arranged from the connecting portion 212 to the extending portion 215 and abut against the inner surface of the slotted hole 133, the at least two annular protruding structures 213 can be deformed due to the flexibility thereof while abutting against the inner surface of the slotted hole 133 and then closely connected to the slotted hole 133, and thus a waterproof barrier can be formed inside the slotted hole 133 so as to prevent the moisture from entering the accommodating space 101. Hence, not only the cost of the waterproof property of traditional button structure which is achieved by coating the waterproof adhesive or installing the O-ring can be omitted, but also the IP67 or a higher level of the international protection marking of the waterproof button module 200 of the present disclosure can be maintained after multiple pressing, and thus the waterproof button module 200 has the excellent effect of waterproofing and dustproofing.

Further, as shown in FIG. 6 and FIG. 7, the number of the at least two annular protruding structures 213 is four, and heights of the four annular protruding structures 213 are gradually increased along a direction from the pressing portion 211 to the touch unit 121. Therefore, multiple waterproof barriers gradually increased along the direction from the pressing portion 211 to the touch unit 121 can be formed, and the specifications of waterproofing and dust-proofing of the waterproof button module 200 can be further enhanced. Furthermore, the heights of the four annular protruding structures 213 gradually increased along the direction from the pressing portion 211 to the touch unit 121 can be respectively 0.16 mm, 0.18 mm, 0.20 mm and 0.23 mm, but the present disclosure are not limited thereto. Similarly, the number of the annular protruding structures 213 of the present disclosure is not limited thereto.

Further, although the figures are not shown, the heights of the four annular protruding structures 213 can be arranged to be the same. At the same time, the slotted hole 133 is arranged to be gradually narrowed along the direction from the pressing portion 211 to the touch unit 121. Therefore, when the four annular protruding structures 213 abut against the inner surface of the slotted hole 133, the interference effect of the four annular protruding structures 213 and the inner surface of the slotted hole 133 are gradually increased along the direction from the pressing portion 211 to the touch unit 121, so the effect of the multiple waterproof barriers gradually increased along the direction from the pressing portion 211 to the touch unit 121 also can be formed.

As shown in FIG. 2, FIG. 5 and FIG. 7 again, the base 130 can further include a first mainbody 131 and a second mainbody 132, wherein the first mainbody 131 is connected to the second mainbody 132, and the first mainbody 131 is connected to the connecting portion 212 of the button mainbody 210. In detail, the inner surface of the slotted hole 133 is disposed on the first mainbody 131, and the second mainbody 132 includes an annular limiting structure 134, wherein the annular limiting structure 134 abuts against the button mainbody 210, and the annular limiting structure 134 is for positioning the button mainbody 210. Further, as shown in FIG. 7, the first mainbody 131 is correspondingly connected to the second mainbody 132 to form an inner space 135 of the base 130, the annular limiting structure 134 is disposed in the inner space 135 of the base 130, and the extending portion 215 of the button mainbody 210 is also disposed in the inner space 135 of the base 130, so that the annular limiting structure 134 abuts against a surface (reference number is omitted) of the extending portion 215. Because the button mainbody 210 is made of the flexible material, the annular limiting structure 134 can abut against the surface of the extending portion 215 and then deform the extending portion 215, and then the extending portion 215 is stably positioned in the inner space 135 of the base 130. Therefore, the displacement or falling off of the button mainbody 210 after multiple pressing can be effectively avoided, and the stability while pressing can be remained, so that the protection effect of the IP67 or the higher level of the waterproof button module 200 can be maintained after more than 10,000 times of pressing.

Figure 8:
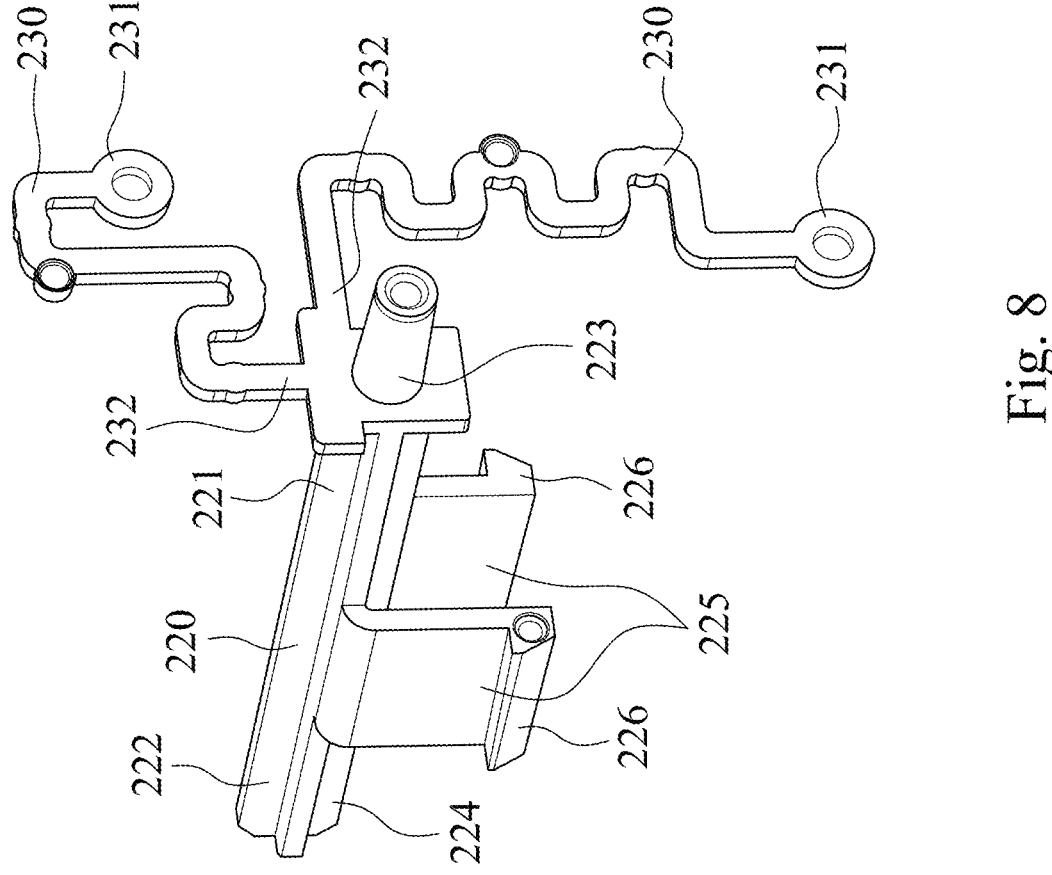
FIG. 8 is a connecting schematic view of a button shaft element and an elastic connecting element of the waterproof button module of FIG. 3.
Figure 9:
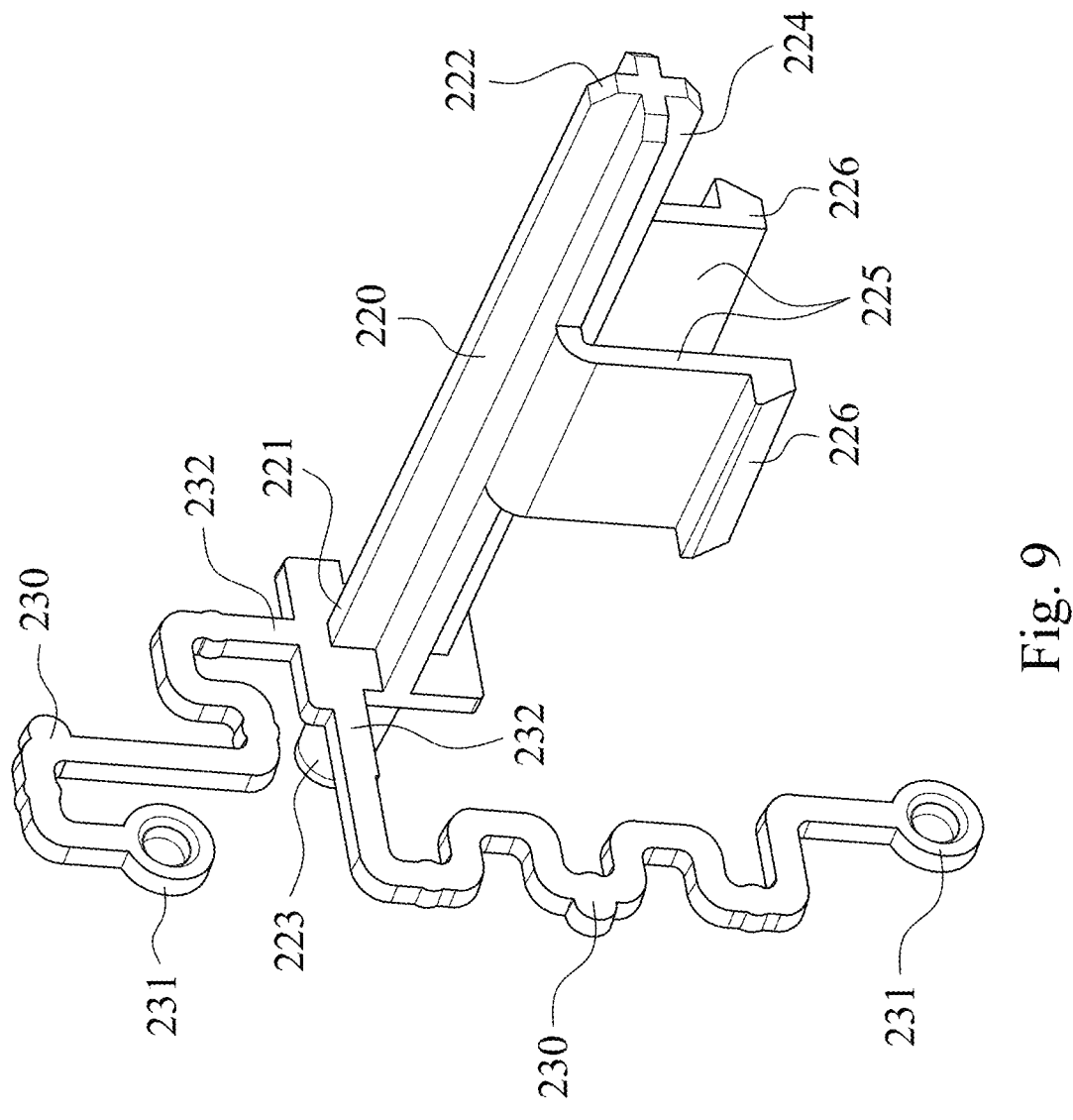
FIG. 9 is a connecting schematic view of the button shaft element and the elastic connecting element of FIG. 8 observed from another direction.
Figure 10:
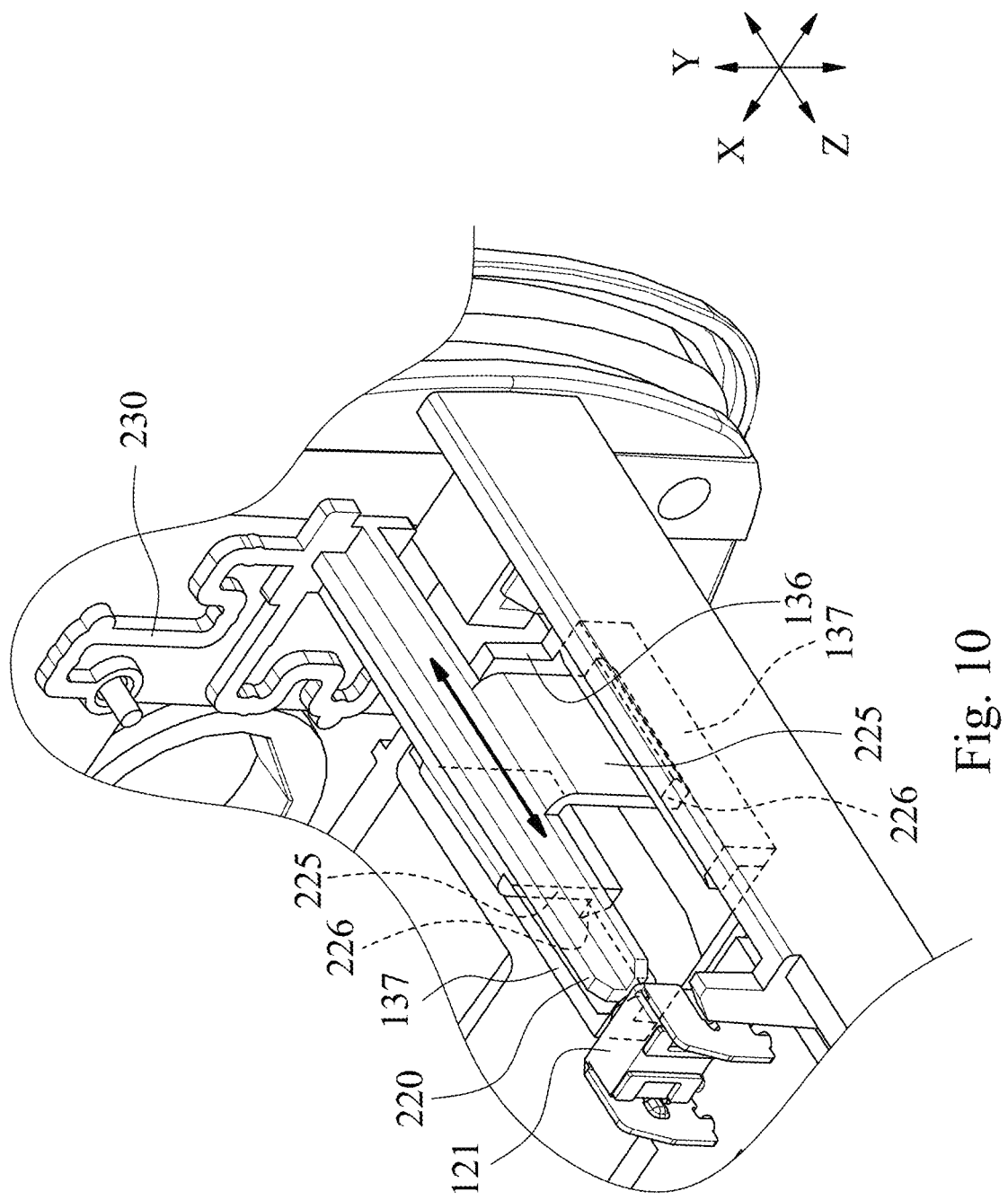
FIG. 10 is an action schematic view of the waterproof button module of FIG. 4.

Reference is made to FIG. 2 to FIG. 5 and FIG. 7 to FIG. 10 simultaneously, wherein FIG. 8 is a connecting schematic view of the button shaft element 220 and the elastic connecting element 230 of the waterproof button module 200 of FIG. 3, FIG. 9 is a connecting schematic view of the button shaft element 220 and the elastic connecting element 230 of FIG. 8 observed from another direction, and FIG. 10 is an action schematic view of the waterproof button module 200 of FIG. 4. In the electronic device 100, the button shaft element 220 is disposed on the base 130, wherein a first end portion 221 of the button shaft element 220 is connected to an inner surface 216 of the button mainbody 210, and a second end portion 222 of the button shaft element 220 is for pressing the touch unit 121. In detail, as shown in FIG. 7, the button mainbody 210 can further include a binding structure 217, the binding structure 217 is disposed on the inner surface 216 of the button mainbody 210, and the button shaft element 220 can include a connecting structure 223. The connecting structure 223 is disposed on the first end portion 221 of the button shaft element 220, and the connecting structure 223 is connected to the binding structure 217. Therefore, the change of the relative position between the button mainbody 210 and the button shaft element 220 of the waterproof button module 200 after multiple pressing can be effectively prevented, and the high alignment between the button mainbody 210 and the button shaft element 220 can be maintained.

As shown in FIG. 4, FIG. 5 and FIG. 8 to FIG. 10 again, a first end 231 of the elastic connecting element 230 is connected to the base 130, and a second end 232 of the elastic connecting element 230 is connected to the button shaft element 220. Specifically, in the waterproof button module 200, the elastic connecting element 230 can be a curved cantilever. The first end 231 of the elastic connecting element 230 is fixedly disposed on the base 130 and extends meanderingly close to the surface of the base 130, and then the second end 232 of the elastic connecting element 230 is connected to the button shaft element 220. Therefore, as shown in FIG. 10, when the button mainbody 210 is pressed and then pushed the button shaft element 220 to displace along a direction towards the touch unit 121, the reset force along a direction towards the button mainbody 210 can be provided by the elastic connecting element 230 to the button shaft element 220, so that the button shaft element 220 can be quickly rebounded and reset after the second end portion 222 thereof touching the touch unit 121. Further, the elastic connecting element 230 can also prevent the button shaft element 220 from excessively touching the touch unit 121, and the damage of the touch unit 121 due to the excessive external force can be avoided. Furthermore, because the amplitude of displacement of the button shaft element 220 along the direction from the button mainbody 210 to the touch unit 121 can be controlled by the elastic connecting element 230, the waterproof button module 200 has an excellent touching feeling for the user, and the button shaft element 220 can be ensured not to be permanent deformation or fracture while bearing excessive force in the process of repeated pressing.

Further, in the waterproof button module 200, a number of the elastic connecting element 230 can be two, the first ends 231 of the two elastic connecting elements 230 are respectively fixedly disposed on the base 130, and the second ends 232 of the two elastic connecting elements 230 are respectively connected to the button shaft element 220. A sum of lengths of the two elastic connecting elements 230 can be 60 mm to 100 mm, or the sum of lengths of the two elastic connecting elements 230 can be 80 mm. Hence, the touching feeling for the user of the waterproof button module 200 can be enhanced, and the probability of the deformation and the fracture caused by the external force applied on the button shaft element 220 can be effectively reduced. Furthermore, the two elastic connecting elements 230 can be fixedly disposed on the base 130 by a hot-melt fixing method so as to omit the use of the additional elements, but the present disclosure is not limited thereto.

Figure 11:
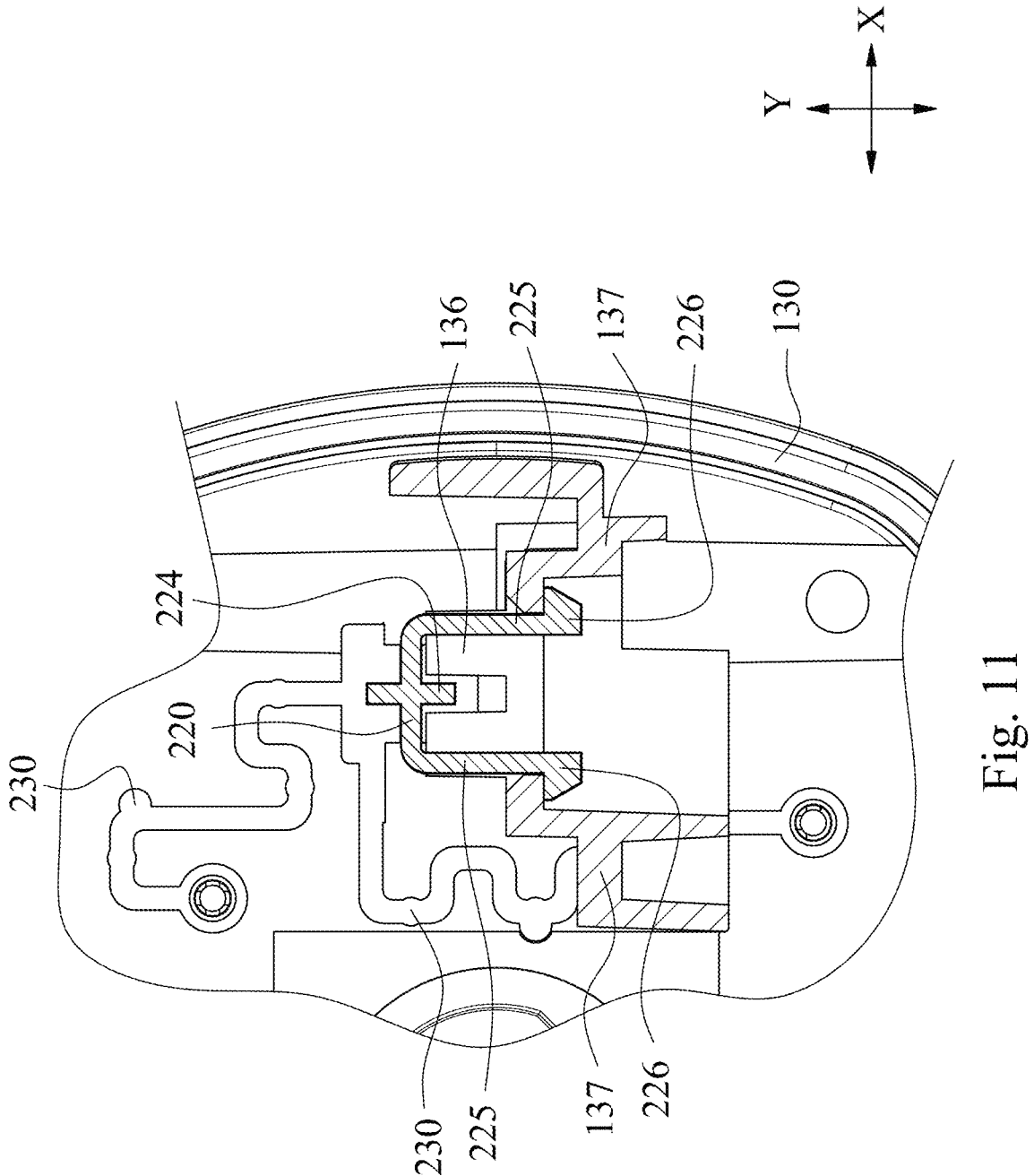
FIG. 11 is a schematic view of the waterproof button module of FIG. 10 observed from a direction of a touch unit.

Reference is made to FIG. 3 to FIG. 5 and FIG. 8 to FIG. 11 simultaneously, wherein FIG. 11 is a schematic view of the waterproof button module 200 of FIG. 10 observed from a direction of the touch unit 121. As shown in FIG. 3 to FIG. 5 and FIG. 8 to FIG. 11, the button shaft element 220 can include a first sliding block 224. The first sliding block 224 extends along a direction from the first end portion 221 to the second end portion 222, and the base 130 can further include a sliding slot 136. The sliding slot 136 is disposed in the accommodating space 101 and located on a side of the base 130 different from the button mainbody 210, and the first sliding block 224 is moveable and limited in the sliding slot 136. Therefore, when the button shaft element 220 is reciprocated along the direction from the button mainbody 210 to the touch unit 121, it is favorable for avoiding the button shaft element 220 from offsetting during the process of reciprocation by the first sliding block 224 limited and disposed in the sliding slot 136, so that the button shaft element 220 can stably transfer the pressing force from the button mainbody 210 to the touch unit 121 of the printed circuit board 120 so as to achieve the demand of the stably pressing.

As shown in FIG. 3 and FIG. 8 to FIG. 11 again, the button shaft element 220 can further include two side plates 225, the two side plates 225 are respectively disposed on two sides of the first sliding block 224, and each of the two side plates 225 includes a second sliding block 226. The base 130 can further include two sliding bases 137, the two sliding bases 137 are disposed in the accommodating space 101 and disposed on the side of the base 130 different from the button mainbody 210, the two second sliding blocks 226 of the two side plates 225 are respectively moveable and limited in the two sliding bases 137, and a direction of height of the first sliding block 224 is vertical to a direction of height of each of the two second sliding blocks 226.

Specifically, the function of touching and pressing of the waterproof button module 200 is achieved by the displacement of the button shaft element 220 in the accommodating space 101, and the effect of stably pressing in the three axes of X-axis, Y-axis and Z-axis in the electronic device 100 can be achieved by the corresponding arrangement of the first sliding block 224, the sliding slot 136, the two second sliding blocks 226 and the two sliding bases 137. As shown in FIG. 10 and FIG. 11, the direction of height of the first sliding block 224 extends from the axial center (reference number is omitted) of the button shaft element 220 to the Y-axis of the electronic device 100. The direction of height of each of the two second sliding blocks 226 extends along the X-axis of the electronic device 100 from each of the two side plates 225 to the direction different from the button shaft element 220. The first sliding block 224 can be moveable and limited in the sliding slot 136, and the two second sliding blocks 226 can be moveable and respectively limited in the two sliding bases 137. When the button shaft element 220 is reciprocated along the Z-axis of the electronic device 100, because the direction of height of the first sliding block 224 extends along the direction of the Y-axis of the electronic device 100, the direction of height of each of the two second sliding blocks 226 extends along the direction of the X-axis of the electronic device 100. At the same time, the shifting along the direction of the X-axis of the electronic device 100 can be avoided when the button shaft element 220 displaces along the Z-axis of the electronic device 100 by the first sliding block 224 disposed in the sliding slot 136. Further, the shifting of the direction of the Y-axis of the electronic device 100 during the displacement of the button shaft element 220 can avoid by the two second sliding blocks 226 respectively limited in the two sliding bases 137. Thus, the pressing force from the button mainbody 210 can be stably transmitted to the printed circuit board 120 along the Z-axis of the electronic device 100 by the elastic reset force of the elastic connecting element 230 of the button shaft element 220, and then the touch unit 121 can be touched by the button shaft element 220 so as to achieve the demand of stably pressing.

As shown in FIG. 3, FIG. 4 and FIG. 10 again, when the button shaft element 220 reciprocates along the direction (i.e., the direction of the Z-axis of the electronic device 100) from the button mainbody 210 to the touch unit 121, the sliding slot 136 abuts against the two side plates 225 of the button shaft element 220 when the button shaft element 220 reciprocates towards the direction of the button mainbody 210. Hence, the button shaft element 220 can be further prevented from excessive rebounding and colliding the inner surface 216 of the button mainbody 210, and the waterproof button module 200 of the present disclosure has excellent operational stability, so that the perfect structural integrity of the waterproof button module 200 can be maintained after more than 10,000 times of pressing, and the protection effect of the IP67 or the higher level can be maintained.

In summary, the electronic device 100 and the waterproof button module 200 of the present disclosure by the arrangement that the button mainbody 210 of the waterproof button module 200 includes the at least two annular protruding structures 213, and the at least two annular protruding structures 213 abut against the inner surface of the slotted hole 133 of the base 130 of the electronic device 100. The moisture and the dust can be prevented from entering the accommodating space 101 of the electronic device 100 through the gap between the button mainbody 210 and the base 130. Therefore, not only the cost of the waterproof property of traditional button structure which is achieved by coating the waterproof adhesive or installing the O-ring can be omitted, but also the IP67 or the higher level of the international protection marking of the waterproof button module 200 of the present disclosure can be maintained after multiple pressing. Further, by the method of the first end 231 of the elastic connecting element 230 is fixedly disposed on the base 130, and the second end 232 of the elastic connecting element 230 is connected to the button shaft element 220, not only the reset force along a direction towards the button mainbody 210 can be provided by the button shaft element 220, but also the pressing feel for the user of the waterproof button module 200 can be enhanced, and the button shaft element 220 can be prevented from excessively touching the touch unit 121, and the damage of the touch unit 121 due to the excessive external force can be avoided. Furthermore, by the corresponding arrangements of the first sliding block 224, the two side plates 225 and the two second sliding blocks 226 of the button shaft element 220, and the sliding slot 136 and the two sliding bases 137 of the base 130, the limited effect of three dimensions of the electronic device 100 can be provided when the button shaft element 220 reciprocates along the direction from the button mainbody 210 to the touch unit 121, and the waterproof button module 200 of the present disclosure has excellent operational stability, so that the protection effect of the IP67 or the higher level of the waterproof button module 200 can be maintained after more than 10,000 times of pressing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A waterproof button module, comprising:
a base comprising a slotted hole;
a button mainbody disposed on the base and covering the slotted hole, wherein the button mainbody is made of a flexible material, and the button mainbody comprises:
a pressing portion exposed to the slotted hole;
a connecting portion integrally connected to and surrounding the pressing portion, and the connecting portion disposed in the slotted hole; and
at least two annular protruding structures separated from each other and disposed on the connecting portion, and the at least two annular protruding structures abutting against an inner surface of the slotted hole;
a button shaft element disposed on the base, wherein a first end portion of the button shaft element is connected to an inner surface of the button mainbody, and a second end portion of the button shaft element is for pressing a touch unit; and
at least one elastic connecting element, wherein a first end of the at least one elastic connecting element is fixedly disposed on the base, and a second end of the at least one elastic connecting element is connected to the button shaft element;
wherein the button mainbody further comprises a binding structure disposed on the inner surface of the button mainbody, the button shaft element comprises a connecting structure disposed on the first end portion, and the connecting structure is connected to the binding structure;
wherein at least one gap is formed between the inner surface of the button mainbody and the connecting structure.

2. The waterproof button module of claim 1, wherein the base further comprises:
a first mainbody connected to the connecting portion, wherein the inner surface of the slotted hole is located on the first mainbody; and
a second mainbody connected to the first mainbody, wherein the second mainbody comprises an annular limiting structure, the annular limiting structure abuts against the button mainbody, and the annular limiting structure is for positioning the button mainbody.

3. The waterproof button module of claim 2, wherein:
the first mainbody is correspondingly connected to the second mainbody to form an inner space of the base, and the annular limiting structure is disposed in the inner space of the base; and
the button mainbody further comprises an extending portion, wherein the extending portion is disposed in the inner space of the base, and the annular limiting structure abuts against a surface of the extending portion.

4. The waterproof button module of claim 1, wherein the button mainbody further comprises:
an annular sheet integrally connected to the pressing portion, and the annular sheet extended from the pressing portion and covering the slotted hole.

5. The waterproof button module of claim 1, wherein heights of the at least two annular protruding structures are gradually increased along a direction from the pressing portion to the touch unit.

6. The waterproof button module of claim 1, wherein the at least one elastic connecting element is a curved cantilever.

7. The waterproof button module of claim 6, wherein a number of the at least one elastic connecting element is two, and a sum of lengths of the two elastic connecting elements is 60 mm to 100 mm.

8. The waterproof button module of claim 1, wherein:
the button shaft element comprises a first sliding block, and the first sliding block extends from the first end portion towards the second end portion; and
the base further comprises a sliding slot, the sliding slot is disposed on a side of the base different from the button mainbody, and the first sliding block is moveable and limited in the sliding slot.

9. The waterproof button module of claim 8, wherein:
the button shaft element further comprises two side plates respectively disposed on two sides of the first sliding block, and each of the two side plates comprises a second sliding block; and
the base further comprises two sliding bases disposed on the side of the base different from the button mainbody, and the two second sliding blocks of the two side plates are respectively moveable and limited in the two sliding bases;
wherein a direction of height of the first sliding block is vertical to a direction of height of each of the second sliding blocks.

10. An electronic device, comprising:
a case element having an accommodating space;
a printed circuit board disposed in the accommodating space, and the printed circuit board comprising a touch unit; and
a waterproof button module disposed on the case element, and the waterproof button module comprising:
a base disposed on the case element, and the base comprising a slotted hole;
a button mainbody disposed on the base and covering the slotted hole, wherein the button mainbody is made of a flexible material, and the button mainbody comprises:
a pressing portion exposed to the slotted hole;
a connecting portion integrally connected to and surrounding the pressing portion, and the connecting portion disposed in the slotted hole; and
at least two annular protruding structures separated from each other and disposed on the connecting portion, and the at least two annular protruding structures abutting against an inner surface of the slotted hole;
a button shaft element disposed on the base, wherein a first end portion of the button shaft element is connected to an inner surface of the button mainbody, and a second end portion of the button shaft element is for pressing the touch unit; and
at least one elastic connecting element, wherein an end of the at least one elastic connecting element is fixedly disposed on the base, and another end of the at least one elastic connecting element is connected to the button shaft element;
wherein the button mainbody further comprises a binding structure disposed on the inner surface of the button mainbody, the button shaft element comprises a connecting structure disposed on the first end portion, and the connecting structure is connected to the binding structure;

wherein at least one gap is formed between the inner surface of the button mainbody and the connecting structure.

11. The electronic device of claim 10, wherein the base further comprises:

a first mainbody connected to the connecting portion, wherein the inner surface of the slotted hole is located on the first mainbody; and a second mainbody connected to the first mainbody, wherein the second mainbody comprises an annular limiting structure, the annular limiting structure abuts against the button mainbody, and the annular limiting structure is for positioning the button mainbody.

12. The electronic device of claim 11, wherein:

the first mainbody is correspondingly connected to the second mainbody to form an inner space of the base, and the annular limiting structure is disposed in the inner space of the base; and the button mainbody further comprises an extending portion, wherein the extending portion is disposed in the inner space of the base, and the annular limiting structure abuts against a surface of the extending portion.

13. The electronic device of claim 10, wherein the button mainbody further comprises:

an annular sheet integrally connected to the pressing portion, and the annular sheet extended from the pressing portion and covering the slotted hole.

14. The electronic device of claim 10, wherein heights of the at least two annular protruding structures are gradually increased along a direction from the pressing portion to the touch unit.

15. The electronic device of claim 10, wherein the at least one elastic connecting element is a curved cantilever.

16. The electronic device of claim 15, wherein a number of the at least one elastic connecting element is two, and a sum of lengths of the two elastic connecting elements is 60 mm to 100 mm.

17. The electronic device of claim 10, wherein:

the button shaft element comprises a first sliding block, and the first sliding block extends from the first end portion towards the second end portion; and the base further comprises a sliding slot, the sliding slot is disposed in the accommodating space, and the first sliding block is moveable and limited in the sliding slot.

18. The electronic device of claim 17, wherein:

the button shaft element further comprises two side plates respectively disposed on two sides of the first sliding block, and each of the two side plates comprises a second sliding block; and the base further comprises two sliding bases disposed in the accommodating space, and the two second sliding blocks of the two side plates are respectively moveable and limited in the two sliding bases;

wherein a direction of height of the first sliding block is vertical to a direction of height of each of the second sliding blocks.

19. A waterproof button module, which is applied to an electronic device, comprising:

a button mainbody made of a flexible material, and the button mainbody comprising:

a pressing portion;

a connecting portion integrally connected to and surrounding the pressing portion, and at least two annular protruding structures separated from each other and disposed on the connecting portion;

a button shaft element, wherein a first end portion of the button shaft element is connected to an inner surface of the button mainbody, and a second end portion of the button shaft element is for pressing a touch unit; and at least one elastic connecting element connected to the button shaft element, wherein the at least one elastic connecting element is a curved cantilever;

wherein the button mainbody further comprises a binding structure disposed on the inner surface of the button mainbody, the button shaft element comprises a connecting structure disposed on the first end portion, and the connecting structure is connected to the binding structure;

wherein at least one gap is formed between the inner surface of the button mainbody and the connecting structure.

20. The waterproof button module of claim 19, wherein a number of the at least one elastic connecting element is two, and a sum of lengths of the two elastic connecting elements is 60 mm to 100 mm.

21. The waterproof button module of claim 19, wherein heights of the at least two annular protruding structures are gradually increased along a direction from the pressing portion to the touch unit.

22. The waterproof button module of claim 19, wherein the button shaft element comprises:

a first sliding block extending from the first end portion towards the second end portion; and two side plates respectively disposed on two sides of the first sliding block, and each of the two side plates comprising a second sliding block;

wherein a direction of height of the first sliding block is vertical to a direction of height of each of the second sliding blocks, the first sliding block is moveable and limited in a sliding slot of the electronic device, and the two second sliding blocks of the two side plates are respectively moveable and limited in the two sliding bases of the electronic device.

* * * * *